United States Patent [19]

Takayashiki et al.

[11] 4,408,386

[45] Oct. 11, 1983

[54] METHOD OF MANUFACTURING SEMICONDUCTOR INTEGRATED CIRCUIT DEVICES

[75] Inventors: Tetsuya Takayashiki; Taiji Usui, both of Tokyo; Tetsuma Sakurai, Hachioji, all of Japan

[73] Assignees: Oki Electric Industry Co., Ltd.; Nippon Telegraph and Telephone Public Corporation, both of Tokyo, Japan

[21] Appl. No.: 326,751

[22] Filed: Dec. 2, 1981

[30] Foreign Application Priority Data

Dec. 12, 1980 [JP] Japan .................................. 55-174691
Feb. 19, 1981 [JP] Japan .................................. 56-222238

[51] Int. Cl.³ ...................... H01L 21/76; H01L 21/20
[52] U.S. Cl. .............................. 29/576 E; 29/576 W; 29/577 C; 29/578; 29/580; 148/175; 156/628; 156/647; 156/649; 156/657; 357/44; 357/49; 357/56
[58] Field of Search ................ 29/576 W, 576 E, 578, 29/577 C, 580; 148/175; 156/628, 647, 648, 649, 657; 357/49, 50, 56

[56] References Cited

U.S. PATENT DOCUMENTS

| | | | |
|---|---|---|---|
| 3,587,166 | 6/1971 | Alexander et al. | 29/578 X |
| 3,721,588 | 3/1973 | Hays | 148/175 |
| 3,813,584 | 5/1974 | Davidsohn et al. | 357/49 X |
| 3,895,392 | 7/1975 | Polata et al. | 357/49 X |
| 3,953,255 | 4/1976 | Combs | 29/580 X |
| 4,017,341 | 4/1977 | Suzuki et al. | 29/580 X |
| 4,056,413 | 11/1977 | Yoshimura | 148/175 |
| 4,089,021 | 5/1978 | Sato et al. | 357/50 X |
| 4,290,831 | 9/1981 | Ports et al. | 29/576 W |

OTHER PUBLICATIONS

1973 International Electron Devices Meeting Technical Digest, Dec. 1973, pp. 41–43.
"Metal Bathtubs in Microcircuits Reduce Collector Resistance", Electronic Equipment Engineering, Dec. 1964, pp. 18–20.
Davidsohn et al., "Dielectric Isolated Integrated Circuit . . . Processes", Proc. IEEE, vol. 57, No. 9, Sep. 1969, pp. 1532–1537.
Wu, L. L., "Doped P & N Pockets for Complementary FETS", I.B.M. Tech. Discl. Bull., vol. 15, No. 7, Dec. 1972, p. 2279.

Primary Examiner—W. G. Saba
Attorney, Agent, or Firm—Wenderoth, Lind & Ponack

[57] ABSTRACT

Spaced recesses are formed in a surface of a low impurity concentration P type single-crystal substrate by using a mask. A P type impurity is diffused at a high concentration into an entire surface of the substrate including the recesses to form a P type diffused layer, and an N type layer is epitaxially grown on the P type diffused layer. Then, mask layers are formed on bottom surfaces of the recesses in the epitaxially grown N type layer and this N type layer is anisotropically etched by using the mask layers to form island regions in the recesses. After removing the mask layers, N type diffused layers are formed to cover the island regions. An insulating film (SiO₂) acting to isolate completed transistor elements is formed on the P and N type diffused layers, and a polycrystalline silicon layer acting as a support of a dielectrically isolated integrated circuit device is formed on the insulating film. Then, the rear surface of the single-crystal silicon substrate is ground off to expose the insulating film. MOS or bipolar type transistor elements are formed in the island regions to obtain a dielectrically isolated semiconductor integrated device.

14 Claims, 35 Drawing Figures

FIG_1a PRIOR ART

FIG_1b PRIOR ART

FIG_1c PRIOR ART

FIG_1d PRIOR ART

FIG_1e PRIOR ART

FIG_1f PRIOR ART

FIG_2a

FIG_2b

FIG_2c

FIG_2d

FIG_2e

FIG_2f

FIG_2g

FIG_2h

FIG_2i

FIG_5a

FIG_5b

FIG_5c

FIG_5d

FIG_5e

METHOD OF MANUFACTURING SEMICONDUCTOR INTEGRATED CIRCUIT DEVICES

BACKGROUND OF THE INVENTION

This invention relates to a method of manufacturing a semiconductor integrated circuit device, and more particularly to a method of manufacturing a dielectrically isolated semiconductor integrated circuit device having semiconductor regions having different conductivity types on the same substrate.

In the manufacture of semiconductor circuit devices it is often necessary to form semiconductor elements having different conductivity types on the same semiconductor chip.

For example, where PNP and NPN bipolar transistors isolated by a PN junction are to be formed on a P type semiconductor substrate, in order to prevent increase in the number of manufacturing steps, usually the PNP transistor would have a lateral construction. Such a PNP transistor having a lateral construction generally has such inferior electric characteristics as the current gain, high frequency characteristics to an NPP transistor having a vertical construction so that it is not suitable to combine the PNP transistor with an NPN transistor to form a complementary circuit.

To form PNP and NPN transistors having excellent electrical characteristics on the same substrate, a semiconductor substrate provided with island regions having different conductivity types and isolated by an insulator has been used.

FIGS. 1a through 1f show successive steps of manufacturing a prior art dielectrically isolated semiconductor integrated circuit device.

Figure 1A:
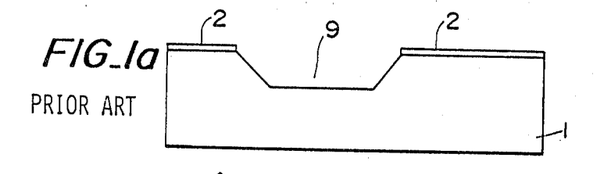
FIGS. 1a through 1f are sectional views showing successive steps of a prior art method of manufacturing a semiconductor integrated circuit device.
Figure 1B:
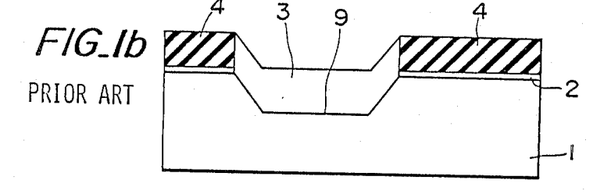
Figure 1C:
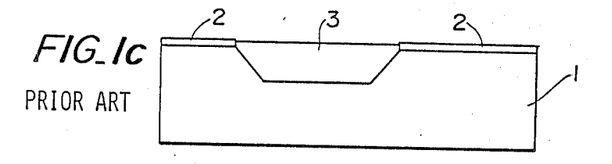
Figure 1D:
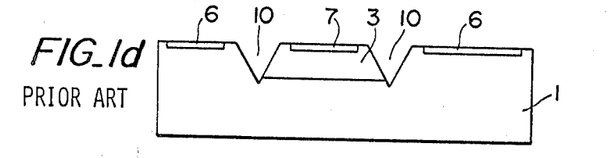
Figure 1E:
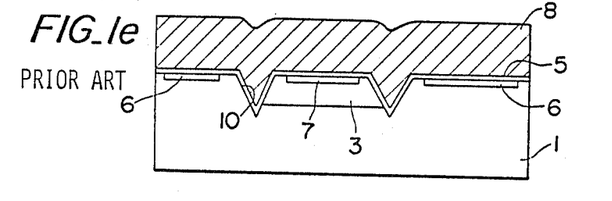
Figure 1F:
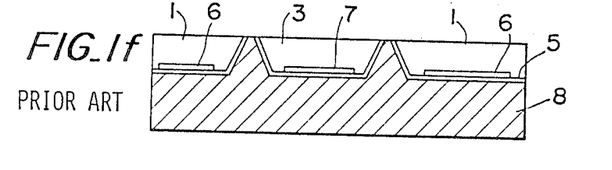

In the step shown in FIG. 1a, the surface of a P type single-crystal silicon substrate 1 having a crystalline surface <100> is anisotropically etched to form a recess 9 by using a selective mask 2. Then, as shown in FIG. 1b, a silicon layer 3 having substantially the same thickness as the depth of the recess 9 is epitaxially grown on the surface of the silicon substrate 1. Since the mask 2 is not single-crystal a polycrystalline silicon layer 4 would be formed on the surface of the mask 2. Then, as shown in FIG. 1c, the epitaxially grown layer 3 and the polycrystalline silicon layer 4 are removed by mechanical grinding. After removing the mask 2, the substrate is subjected twice to photolithographic steps to form by diffusion a high concentration diffused regions 6 on a selected surface portion on the substrate 1 and a high concentration diffused region 7 on a selected surface portion of the epitaxially grown layer 3. Then, as shown in FIG. 1d, the epitaxially grown layer 3 is selectively and anisotropically etched off to form a V-shaped groove 10. Then, as shown in FIG. 1e, a silicon oxide film 5 is thermally grown on the entire surface of the substrate 1, and thereafter a polycrystalline silicon layer 8 acting as a supporting substrate is formed on the entire surface of the silicon oxide film 5. Then, as shown in FIG. 1f, the single-crystal silicon layer is removed from the rear side of the substrate 1 until the oxide film 5 is exposed to form a dielectrically isolated substrate having island regions of different conductivity types.

However, the method described above has the following defects.

More particularly, when forming an epitaxially grown layer on a silicon substrate, since a polycrystalline layer is simultaneously formed, the grown surface of the silicon wafer (silicon substrate) becomes concave. This phenomenon is considered to be caused by the fact that the single-crystal silicon and the polycrystalline silicon have different physical characteristics. Especially when the thickness of the epitaxially grown layer exceeds 30 microns, the warping of the wafer becomes remarkable. Since such warping of the wafer results in a strain in the crystalline structure of the silicon, the strain degrades the electric characteristics of a bipolar transistor element, particularly the current amplification factor and the noise characteristic in a low current region. Moreover, the warping of the wafer causes nonuniform the temperature distribution in the wafer which results in a nonuniformity of the thickness of the epitaxially grown film and growth of a unnecessary epitaxially grown layer or a polycrystalline silicon layer on the rear surface of the wafer.

The method of manufacturing a dielectrically isolated substrate is generally complicated, and the mechanical grinding step performed subsequent to the epitaxially growing step increases the cost of manufacturing. An etching process may be substituted for the grinding step, but as the etching rates of the epitaxially grown layer and the polycrystalline layer are not the same, it is impossible to obtain a flat surface. Moreover, as high impurity regions are formed in the surfaces of the silicon substrate and the epitaxially grown layer, two photolithographic steps are necessary which increases the number of manufacturing steps.

SUMMARY OF THE INVENTION

It is an object of this invention to provide an improved method of manufacturing a dielectrically isolated semiconductor integrated circuit device capable of preventing warping of the semiconductor wafer during the epitaxial growth step.

Another object of this invention is to provide a method of manufacturing a semiconductor integrated circuit device capable of decreasing the number of steps of photolithographic steps and of the mechanical grinding steps, thus decreasing the cost of manufacturing.

Still another object of this invention is to provide A method of manufacturing a bipolar type semiconductor integrated circuit device wherein the strain of the crystals of the island regions is decreased to improve the current amplification factor and the noise characteristic of the device.

According to one embodiment of this invention, there is provided a method of manufacturing a semiconductor integrated circuit device comprising the steps of forming spaced recesses having a predetermined depth and an opening size in a surface of a single-crystal silicon substrate of a first conductivity type; forming a first conductivity type diffused layer of a high impurity concentration on surfaces of the single-crystal silicon substrate and the recesses; forming a second conductivity type epitaxially grown layer on a surface of the first conductivity type diffused layer; forming mask layers on selected surface portions of the epitaxially grown layer above the recesses; removing the epitaxially grown layer at portions other than those immediately beneath and near the mask layers to form second conductivity type island regions in the recesses; removing the mask layers to expose surfaces of the island regions; forming second conductivity type diffused layers in the exposed surfaces of the island regions; forming an oxide film on the surfaces of the first conductivity type diffused layer and the second conductivity type diffused layer; forming a polycrystalline silicon layer on a surface of the oxide film; and removing a rear surface of the single-crystal silicon substrate until the oxide film is exposed.

According to another embodiment of this invention, there is provided a method of manufacturing a semiconductor integrated circuit device comprising the steps of forming spaced recesses having a predetermined depth and an opening size in a surface of a single-crystal silicon substrate of a first conductivity type; forming first mask layers on bottom surfaces of the recesses; forming a first conductivity type diffused layer containing an impurity at a high concentration in an exposed surface of the single-crystal silicon substrate; removing the first mask layers; forming a second conductivity type epitaxially grown layer overlying the first conductivity type diffused layer and bottom surfaces of the recesses; forming second mask layers on selected surface portions of the epitaxially grown layer above the recesses; removing the epitaxially grown layer at portions other than those immediately beneath and near the second mask layer to form second conductivity type island regions in the recesses; removing the second mask layers to expose surfaces of the island regions; forming a second conductivity type diffused layer containing an impurity at a high concentration on the exposed surfaces of the island regions; forming an oxide film on the surfaces of the first conductivity type diffused layer and of the second conductivity type diffused layer; forming a polycrystalline silicon layer on a surface of the oxide film; and removing a rear surface of the single-crystal silicon substrate until the oxide film is exposed.

According to still another embodiment of this invention there is provided a method of manufacturing a semiconductor integrated circuit device comprising the steps of forming a mask on a surface of a single-crystal silicon substrate having a first conductivity type; forming spaced recesses having a predetermined depth and opening size in the surface of the single-crystal silicon substrate by using the mask; forming a first oxide layer on surfaces of the recesses; removing the mask to expose the surface of the single-crystal silicon substrate; forming a first conductivity type diffused layer containing an impurity at a high concentration on the exposed surface of the single-crystal silicon substrate; forming a second conductivity type epitaxially grown layer on the surfaces of the recesses and of the first conductivity type diffused layer; forming a second conductivity type diffused layer containing an impurity at a high concentration in a surface portion of the epitaxially grown layer; forming a mask layer on a selected surface portion of the second conductivity type diffused layer overlying the recesses; removing the epitaxially grown layer at portions other than those immediatly beneath the mask layer and close thereto to form second conductivity type island regions in the recesses; removing the mask layer at portions overlying the recesses; then forming a second oxide film on the entire surface of the single-crystal silicon substrate; forming a polycrystalline silicon layer on the second oxide film; and removing a rear side of the single-crystal silicon substrate until the second oxide film is exposed.

According to yet another modification of this invention, there is provided a method of manufacturing a semiconductor integrated circuit device comprising the steps of forming an insulating layer containing a first conductivity type impurity at a high concentration on a surface of a single-crystal silicon substrate of a first conductivity type; forming spaced openings of a predetermined size through the insulating layer; heat treating the single-crystal silicon substrate to form a first conductivity type diffused layer containing an impurity at a high concentration immediately beneath the insulating layer; removing the single-crystal silicon substrate at portions beneath the openings to form recesses having a predetermined depth; removing the insulating layer; then forming a second conductivity type epitaxially grown layer on surfaces of the recesses and of the first conductivity type diffused layer; forming a second conductivity type diffused layer containing an impurity at a high concentration in a surface portion of the epitaxially grown layer; forming a mask layer on a selected surface portion of the second conductivity type diffused layer overlying the recesses; removing the epitaxially grown layer and the second conductivity type diffused layer at portions other than those immediately beneath the mask layer and close thereto to form second conductivity type island regions in the recesses; removing the mask layer overlying the recesses to expose the single-crystal silicon substrate; forming an oxide film on the entire surface of the single-crystal silicon substrate; forming a polycrystalline silicon layer on a surface of the oxide film; and removing the single-crystal silicon substrate until the oxide layer is exposed.

In all embodiments, the island regions are used to form MOS or bipolar transistors constituting an integrated circuit device.

DESCRIPTION OF THE PREFERRED EMBODIMENTS

A preferred embodiment of this invention will now be described with reference to FIGS. 2a through 2i.

Figure 2A:
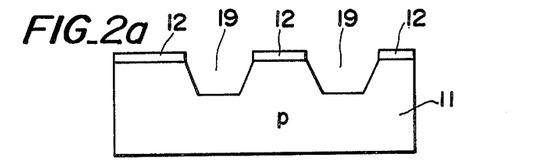
FIGS. 2a through 2i are sectional views showing successive steps of one embodiment of the method of this invention.

A P type single-crystal silicon substrate 11 is prepared having a relatively low impurity concentration of the order of $1 \times 10^{14} - 5 \times 10^{15}/cm^3$ and a <100> plane or a plane of orientation near it, and a mask 12 of silicon dioxide $SiO_2$ or silicon nitride $Si_3N_4$ is applied onto one surface of the substrate 11. Then, the substrate is anisotropically etched to form a plurality of recesses 19 having a predetermined spacing, depth and opening size. The depth of the recesses 19 is determined by the breakdown voltage of the semiconductor elements to be formed and should be larger than 20 microns for a bipolar transistor having a breakdown voltage of 200 V, for example.

Figure 2B:
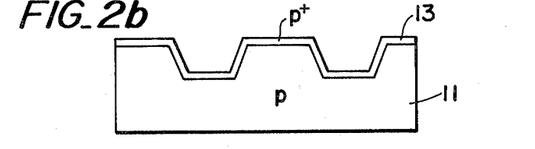

As shown in FIG. 2b, after removing the mask 12, a P type impurity, for example boron, is diffused into the entire surface of the silicon substrate 11 including the recesses 19 at a high concentration of higher than $5 \times 10^{19}/cm^3$ for forming a P type diffused layer 13 which is used to decrease the collector resistance of a PNP transistor.

Figure 2C:
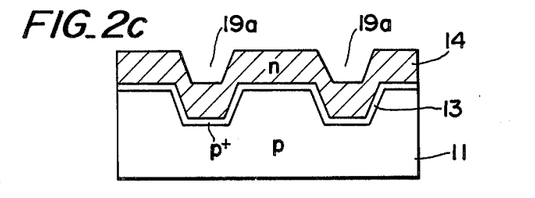

Then, as shown in FIG. 2c, an N type epitaxially grown layer 14 having a desired impurity concentration and thickness is formed on the surface of the P type diffused layer 13. The thickness of the n type epitaxially grown layer 14 is substantially the same as the depth of the recesses 19 formed on the surface of the silicon substrate 11.

In FIG. 2c, a reference numeral 19a represents newly formed recesses at positions of the N type epitaxial layer 14 corresponding to the recesses 19.

Figure 2D:
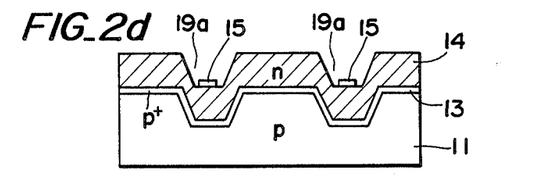

Thereafter, as shown in FIG. 2d, mask layers 15 made of SiO₂ films, for example, are formed on the bottoms of the newly formed recesses 19a formed in the N type epitaxially grown layer 14. At this step, although it is necessary to apply photolithographic technique to the surfaces having a level difference of several tens microns, it was found that it was possible to form patterns at a high accuracy sufficient to be practically used.

Figure 2E:
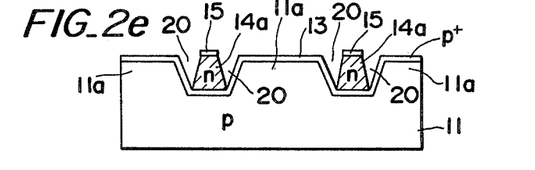

Then, as shown in FIG. 2e, the epitaxially grown layer 14 is anisotropically etched by using the mask layers 15 to form V shaped grooves having an angle of about 70° on the surface of the silicon substrate 11 so as to form island regions 11a and 14a.

The etching solution utilized in the anisotropic etching step comprises an alkaline etching solution (for example KOH, ethylenediamine pyrocatechol). The etching rate of this etching solution for the P type silicon depends on the impurity concentration of silicon, and the etching rate of silicon having a high P type concentration, for example, higher than $5 \times 10^{19}/cm^3$ is decreased to about 1/100 of that of silicon having a lower impurity concentration so that selective etching becomes possible. For this reason, where the V shaped grooves 20 are formed the etching of the epitaxially grown layer 14 is automatically stopped at the high impurity P type diffused layer 13.

Figure 2F:
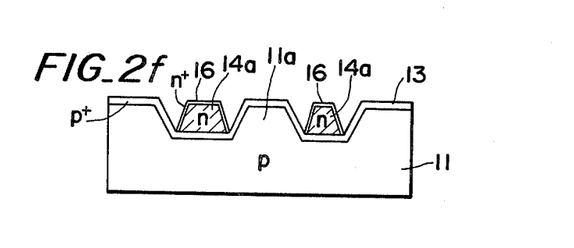

Then, as shown in FIG. 2f, after the mask layer 15 has been removed, an N type impurity, for example antimony or arsenic, is diffused into the surfaces of the P type diffused layer 13 and the island regions 14a at a concentration lower than that of the diffused layer 13 but higher than that of the island regions 14a on the silicon substrate 11. Consequently, N type diffused layers 16 having a high impurity concentration are formed for decreasing the collector resistance of an NPN type transistor to be formed, but the diffused layer 13 would not be converted into N type because of its high P type impurity concentration.

Figure 2G:
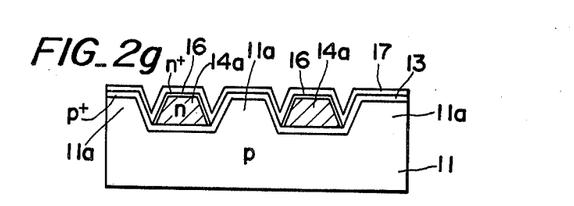

Then, as shown in FIG. 2g, a silicon dioxide (SiO₂) film 17 acting as an insulator for isolating semiconductor element is formed on the P type and N type diffused layers 13 and 16.

Figures 2H, 2I:
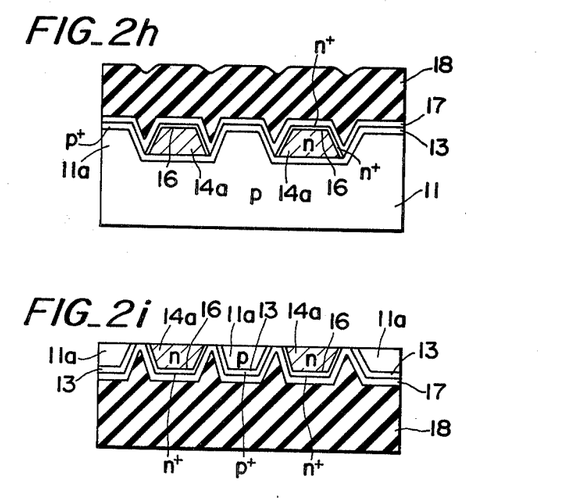

Next, as shown in FIG. 2h, a polycrystalline silicon layer 18 having a thickness of several hundreds microns is formed on the surface of the oxide film 17 to act as a supporting substrate of a dielectrically isolated integrated circuit.

Then, as shown in FIG. 2i, the rear surface of the silicon substrate 11 is ground off until the oxide film 17 is exposed and the exposed surface is lapped to form a dielectrically isolated substrate with mirror-like surface having regions of different conductivity types.

Thereafter, a well known steps of manufacturing a semiconductor integrated circuit are performed to form MOS or bipolar transistor elements having different conductivity types in the island regions 11a and 14a.

Another embodiment of this invention will be described with reference to FIGS. 3a through 3e.

Figure 3A:
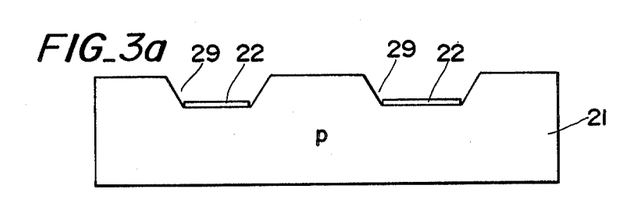
FIGS. 3a through 3e are sectional views showing successive steps of a modified embodiment of this invention.

At first, a single-crystal silicon substrate 21 is anisotropically etched to form recesses 29 as shown in FIG. 3a, and then mask layers 22 consisting of SiO₂ or Si₃N₄ are formed on the bottom surfaces of the recesses 29.

Figure 3B:
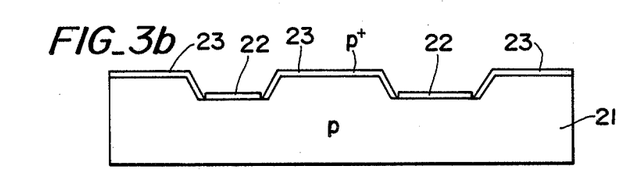

Then, as shown in FIG. 3b, a high concentration P type diffused layer 23 is formed on the exposed surface of the single-crystal silicon substrate.

Figure 3C:
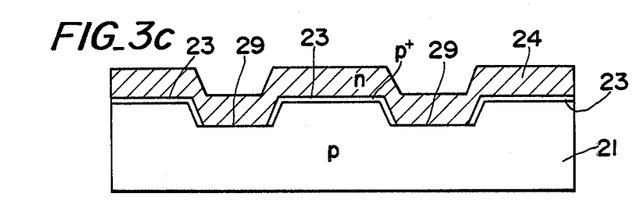

After removing the mask layers 22, an N type epitaxially grown layer 24 is grown on the surfaces of the P type diffused layer 23 and the recesses 29 as shown in FIG. 3c.

Figure 3D:
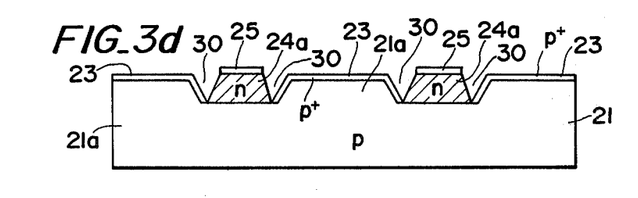

Then, as shown in FIG. 3d, mask layers 25 (made of SiO₂, for example) are formed on the epitaxially grown layer 24 in the recesses 29 and then the epitaxially grown layer 24 is selectively etched to form V shaped grooves 30 which define island regions 21a and 24a.

Figure 3E:
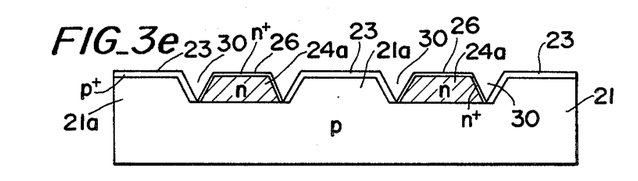

Then, after removing the mask layers 25, an N diffused layer 26 having a high impurity concentration is formed on the surface of the island region 24a.

Thereafter, a dielectrically isolated substrate is formed by the same steps as those shown in FIGS. 2g through 2i.

This modified embodiment is characterized in that since there is no high concentration P type diffused layer at the interface between the N type island region 24a and the silicon substrate 21 there is no fear of diffusing the P type impurity into the N type island region 24a to convert the surface thereof into P type conductivity.

As above described, according to the method of this invention, since strain in the single-crystal silicon caused by the warping of the wafer during the epitaxial growth step is prevented, the characteristics of the resulting integrated circuit device can be improved. Since, according to this invention, only one mechanical grinding step is sufficient, it is possible to reduce the manufacturing cost.

This invention is especially effective for a dielectrically isolated bipolar integrated circuit device utilized in a telephone subscriber circuit or an audio circuit requiring a high breakdown voltage of the order of higher than 100 V. Further, the invention is useful for manufacturing a MOS integrated circuit, more particularly a complementary MOS integrated circuit perfectly free from a latch phenomenon.

Figure 4A:
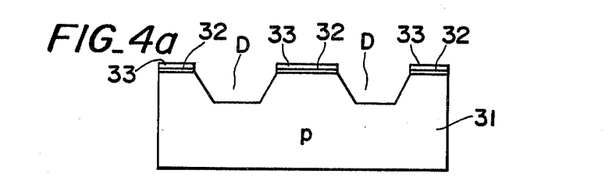
FIGS. 4a through 4j are sectional views showing successive steps of another embodiment of the method of this invention.

FIGS. 4a through 4j show successive steps of another embodiment of the method of this invention. At first, a P type silicon single-crystal substrate 31 having the same crystal orientation and impurity concentration as the substrate 11 shown in FIG. 2 is prepared. A relatively thin oxide film 32 (SiO₂, for example) having a thickness of about 1000 Å is formed on the surface of the substrate 31 and then a silicon nitride (Si₃N₄) film 33 of the same thickness is deposited on the silicon oxide film 32, as shown in FIG. 4a. These thin films 32 and 33 are photoetched to form a mask of a desired pattern which is used to anisotropically etch the silicon substrate 31 to form spaced recesses D having a predetermined depth and opening size in the upper surface of the silicon substrate 31. The depth of these recesses is determined by the breakdown strength of the semiconductor elements to be formed, and where the semiconductor elements are bipolar transistors, a depth of more than 20 microns is necessary.

Figure 4B:
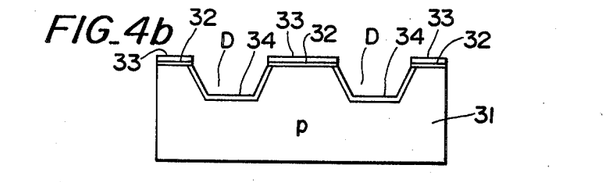

Then, as shown in FIG. 4b, the silicon substrate is heated in an oxygen atmosphere at a temperature of higher than 1000° C. to form a thermally grown silicon oxide film 34 having a thickness of more than several thousands angstrom units.

Figure 4C:
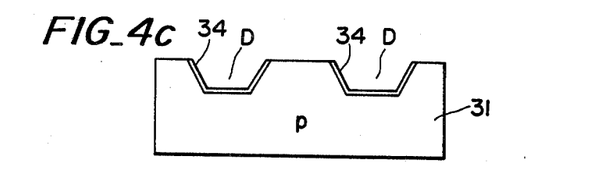

Then, as shown in FIG. 4c, the silicon oxide film 32 and the silicon nitride film 33 are etched off to expose the surface of the silicon substrate 31. Since the thickness of the silicon oxide film 34 is considerably larger than that of the silicon oxide film 32, the silicon oxide film 34 will be left without being substantially etched.

Figure 4D:
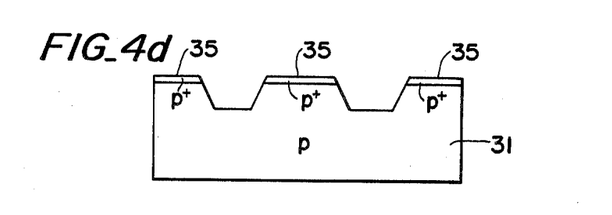

Then, as shown in FIG. 4d, a P type impurity is diffused into the surface of the silicon substrate 31 at a high concentration of more than $5 \times 10^{19}/cm^3$ to form a P type diffused layer 35 utilized to decrease the collector resistance of a PNP transistor. Thereafter, the silicon oxide film 34 is removed.

Figure 4E:
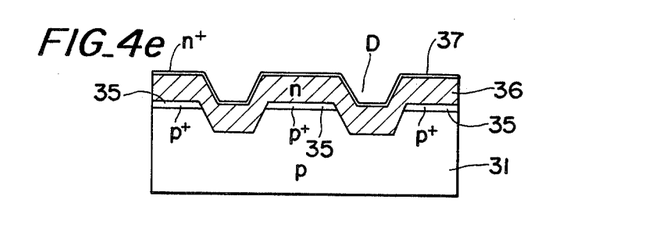

Then, as shown in FIG. 4e, an N type epitaxially grown layer 36 having a predetermined impurity concentration and thickness is grown on the surface of the silicon substrate 31.

Then, an N type impurity is diffused at a high concentration into the surface of the N type epitaxially grown layer 36 to form an N type diffused layer 37 utilized to decrease the collector resistance of an NPN bipolar transistor to be formed.

Figure 4F:
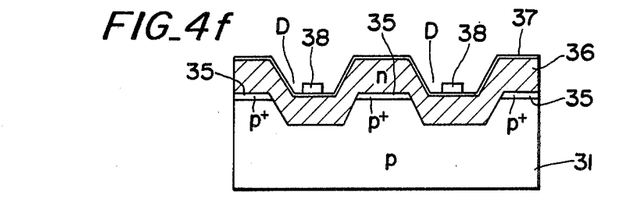

Then, as shown in FIG. 4f, mask layers 38 (for example, SiO$_2$) are selectively formed on the epitaxially grown layers 36 in the recesses D. This process step requires to subject to photolithographic etching the surfaces having a level difference of about several tens microns, but it was found that it is possible to form an highly accurate pattern that can be used practically.

Figure 4G:
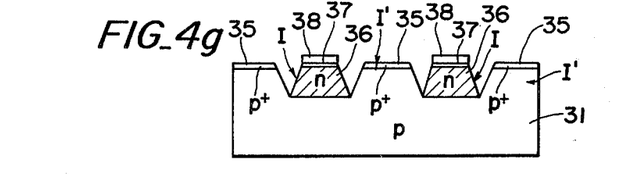

Then, as shown in FIG. 4g, the epitaxially grown layer 36 is anisotropically etched by using the mask layers 38 to form V shaped grooves of about 70°, thereby forming N type island regions I and P type island regions I'.

The etching solution for the anisotropic etching process may be the same alkaline etchant as that used in the first embodiment. The etching rate of this etching solution for the P type silicon depends upon the impurity concentration of silicon. The etching rate for silicon containing a P type impurity at a high concentration of higher than $5 \times 10^{19}/cm^3$ is reduced to about 1/100 of that for silicon having lower impurity concentration, so that selective etching becomes possible. Accordingly, where V shaped grooves are formed, the etching of the epitaxially grown layer 36 is automatically stopped at the high concentration P type diffused layer 35.

Figure 4H:
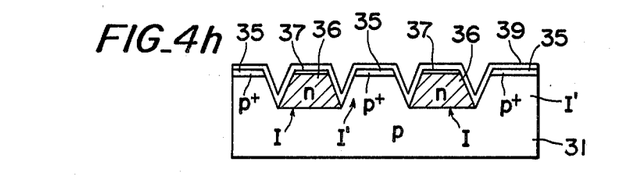

After the mask layer 38 has been removed, a silicon dioxide (SiO$_2$) film 39 is formed over the entire surface of the silicon substrate 31 as shown in FIG. 4h to act as an insulator for isolating semiconductor elements to be formed later.

Figure 4I:
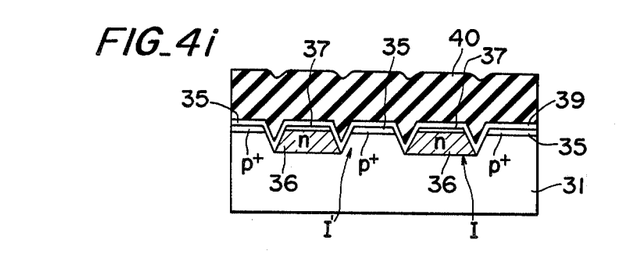

Then, as shown in FIG. 4i, a polycrystalline silicon layer 40 having a thickness of several hundreds microns is formed on the surface of the oxide film 39 to act as a supporting substrate.

Figure 4J:
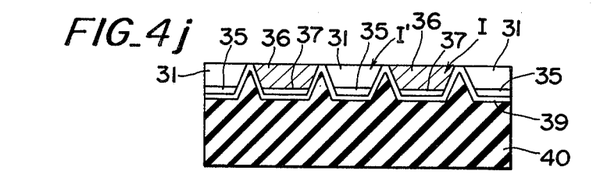

Then, as shown in FIG. 4j, the surface of the silicon substrate 31 is mirror ground until the oxide film 39 is exposed, so as to form an insulator isolated substrate having different conductivity regions on the same plane.

Then, by using a conventional method of manufacturing a semiconductor integrated circuit device, MOS or bipolar transistor elements having different conductivity types are formed in respective island regions I and I'.

Still further embodiments of this invention will now be described with reference to FIGS. 5a through 5e.

Figure 5A:
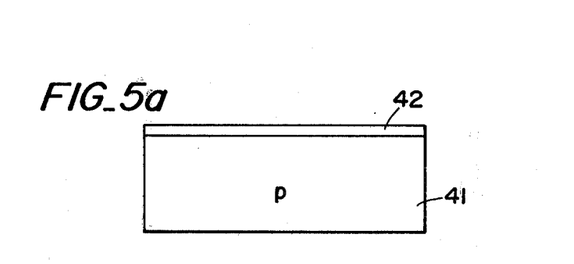
FIGS. 5a through 5e are sectional views showing successive steps of still another embodiment of this invention.

At first, as shown in FIG. 5a, an insulator layer 42 containing a P type impurity at a high concentration of $5 \times 10^{19} - 5 \times 10^{20}/cm^3$ (for example, a chemical vapor deposited (CVD) silicon dioxide SiO$_2$ containing boron) is formed on the surface of a P type monocrystalline silicon substrate 41.

Figure 5B:
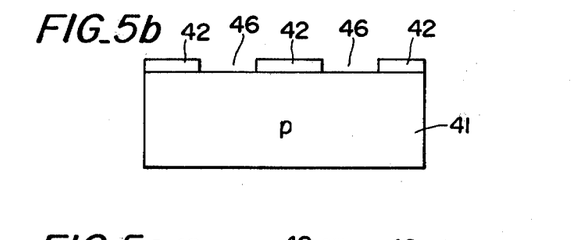

Then, as shown in FIG. 5b, spaced openings 46 having a predetermined size are formed through the insulating layer 42 by using photolithographic technique.

Figure 5C:
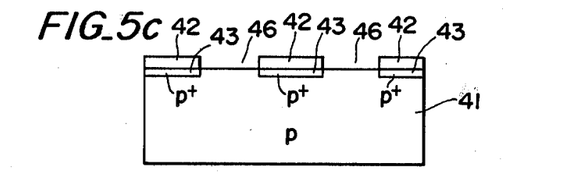

Then, as shown in FIG. 5c, high impurity concentration P type diffused layers 43 are formed immediately beneath the insulating layer 42 by diffusion technique.

Figure 5D:
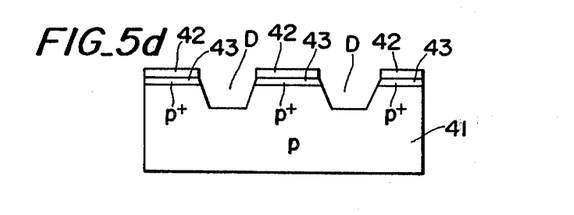

Then, as shown in FIG. 5d, the silicon substrate 41 is anisotropically etched by using the insulating layer 42 as a mask, thereby forming spaced recesses D in the silicon substrate 41.

Figure 5E:
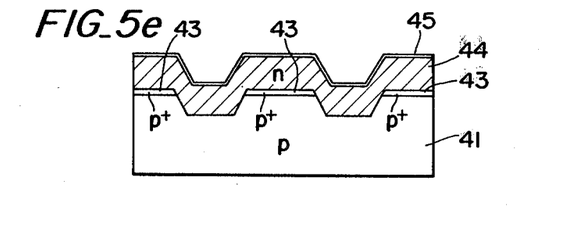

Then, as shown in FIG. 5e, an N type epitaxially grown layer 44 is grown over the entire surface of the silicon substrate 41, and thereafter an N type impurity is diffused in the surface of the epitaxially grown layer 44 at a high density to form an N type diffused layer 45.

Then, the same steps as shown in FIGS. 4f through 4j are used to form dielectrically isolated substrates having different conductivity types.

The modified method described with reference to FIGS. 5a through 5e does not require to form a silicon nitride film or a selective oxide film shown in FIGS. 4a, 4b and 4c, and can simplify the photolithographic step.

Again, since no polycrystalline silicon film that causes warping of the wafer is formed during the epitaxial growth step, it is possible to decrease stress in the crystals of the wafer thus improving the electrical characteristics of the completed integrated semiconductor device. Furthermore, according to this modification, since only one mechanical grinding operation is sufficient the manufacturing cost can be reduced.

What is claimed is:

1. A method of manufacturing a semiconductor integrated circuit device comprising the steps of:

forming spaced recesses having a predetermined depth and an opening size in a surface of a single-crystal silicon substrate of a first conductivity type;

forming a first conductivity type diffused layer of a high impurity concentration on surfaces of said single-crystal silicon substrate and said recesses;

forming a second conductivity type epitaxially grown layer on a surface of said first conductivity type diffused layer;

forming mask layers on selected surface portions of said epitaxially grown layer above said recesses;

removing said epitaxially grown layer at portions other than those immediately beneath and near said mask layers to form second conductivity type island regions in said recesses;

removing said mask layers to expose surfaces of said island regions;

forming second conductivity type diffused layers in said exposed surfaces of said island regions;

forming an oxide film on the surfaces of said first conductivity type diffused layer and said second conductivity type diffused layer;

forming a polycrystalline silicon layer on a surface of said oxide film; and removing a rear surface of said single-crystal silicon substrate until said oxide film is exposed.

2. The method according to claim 1 wherein said first conductivity type is a P conductivity type and said second conductivity type is an N conductivity type.

3. A method of manufacturing a semiconductor integrated circuit device comprising the steps of:
forming spaced recesses having a predetermined depth and an opening size in a surface of a single-crystal silicon substrate of a first conductivity type;
forming first mask layers on bottom surfaces of said recesses;
forming a first conductivity type diffused layer containing an impurity at a high concentration in an exposed surface of said single-crystal silicon substrate;
removing said first mask layers;
forming a second conductivity type epitaxially grown layer overlying said first conductivity type diffused layer and bottom surfaces of said recesses;
forming second mask layers on selected surface portions of said epitaxially grown layer above said recesses;
removing said epitaxially grown layer at portions other than those immediately beneath and near said second mask layers to form second conductivity type island regions in said recesses;
removing said second mask layers to expose surfaces of said island regions;
forming second conductivity type diffused layer containing an impurity at a high concentration on said exposed surfaces of said island regions;
forming an oxide film on the surfaces of said first conductivity diffused layer and of said second conductivity type diffused layer;
forming a polycrystalline silicon layer on a surface of said oxide film; and
removing a rear surface of said single-crystal silicon substrate until said oxide film is exposed.

4. The method according to claim 3 wherein said first conductivity type is a P conductivity type and said second conductivity type is an N conductivity type.

5. The method according to claim 1 or 3 wherein said portions of said epitaxially grown layer are removed by anisotropic etching technique.

6. The method according to claim 1 or 3 wherein the impurity concentration of said second conductivity type diffused layer is lower than that of said first conductivity type diffused layer but higher than that of said island regions.

7. The method according to claim 1 or 3 which further comprises the step of forming transistor elements having different conductivity types in said island regions.

8. The method according to claim 7 wherein said transistor elements comprise MOS type transistors.

9. The method according to claim 7 wherein said transistor elements comprise bipolar transistors.

10. The method according to claim 1 or 3 wherein said single-crystal silicon substrate has a relatively low impurity concentration of the order of from $1 \times 10^{14}$ to $5 \times 10^{15}/cm^3$ and a crystalline orientation of about $<100>$.

11. A method of manufacturing a semiconductor integrated circuit device comprising the steps of:
forming a mask on a surface of a single-crystal silicon substrate having a first conductivity type;
forming spaced recesses having a predetermined depth and an opening size in the surface of said single-crystal silicon substrate by using said mask;
forming a first oxide layer on surfaces of said recesses;
removing said mask to expose the surface of said single-crystal silicon substrate;
forming a first conductivity type diffused layer containing an impurity at a high concentration on the exposed surface of said single-crystal silicon substrate;
forming a second conductivity type epitaxially grown layer on the surfaces of said recesses and of said first conductivity type diffused layer;
forming a second conductivity type diffused layer containing an impurity at a high concentration in a surface portion of said epitaxially grown layer;
forming a mask layer on a selected surface portion of said second conductivity type diffused layer overlying said recesses;
removing said epitaxially grown layer at portions other than those immediately beneath said mask layer and close thereto to form second conductivity type island regions in said recesses;
removing said mask layer at portions overlying said recesses;
then forming a second oxide film on the entire surface of said single-crystal silicon substrate;
forming a polycrystalline silicon layer on said second oxide film; and
removing a rear side of said single-crystal silicon substrate until said second oxide film is exposed.

12. The method of manufacturing a semiconductor integrated circuit device according to claim 11 wherein said second conductivity type is an N type.

13. A method of manufacturing a semiconductor integrated circuit device comprising the steps of:
forming an insulating layer containing a first conductivity type impurity at a high concentration on a surface of a single-crystal silicon substrate of a first conductivity type;
forming spaced openings of a predetermined size through said insulating layer;
heat treating said single-crystal silicon substrate to form a first conductivity type diffused layer containing an impurity at a high concentration immediately beneath said insulating layer;
removing said single-crystal silicon substrate at portions beneath said openings to form recesses having a predetermined depth;
removing said insulating layer;
then forming a second conductivity type epitaxially grown layer on surfaces of said recesses and of said first conductivity type diffused layer;
forming a second conductivity type diffused layer containing an impurity at a high concentration in a surface portion of said epitaxially grown layer;
forming a mask layer on a selected surface portion of said second conductivity type diffused layer overlying said recesses;
removing said epitaxially grown layer and said second conductivity type diffused layer at portions other than those immediately beneath said mask layer and close thereto to form second conductivity type island regions in said recesses;
removing said mask layer overlying said recesses to expose said single-crystal silicon substrate;

forming an oxide film on the entire surface of said single-crystal silicon substrate;

forming a polycrystalline silicon layer on a surface of said oxide film; and removing said single-crystal silicon substrate until said oxide layer is exposed.

14. The method according to claim 13 wherein said first conductivity type is a P type and said second conductivity type is an N type.

* * * * *